United States Patent
Kamikawa et al.

(10) Patent No.: US 7,750,363 B2
(45) Date of Patent: Jul. 6, 2010

(54) NITRIDE SEMICONDUCTOR LIGHT-EMITTING DEVICE HAVING AN END FACE COATING FILM AND METHOD OF MANUFACTURING THE SAME

(75) Inventors: Takeshi Kamikawa, Mihara (JP); Yoshinobu Kawaguchi, Mihara (JP)

(73) Assignee: Sharp Kabushiki Kaisha, Osaka (JP)

(*) Notice: Subject to any disclaimer, the term of this patent is extended or adjusted under 35 U.S.C. 154(b) by 43 days.

(21) Appl. No.: 11/543,085

(22) Filed: Oct. 5, 2006

(65) Prior Publication Data

US 2007/0080368 A1    Apr. 12, 2007

(30) Foreign Application Priority Data

Oct. 7, 2005    (JP)    ............................. 2005-294361

(51) Int. Cl.
 *H01L 29/74* (2006.01)
(52) U.S. Cl. .................. 257/103; 257/98; 257/E33.06; 257/E33.069; 372/49.01
(58) Field of Classification Search .................. 257/13, 257/103, 618, 918, E51.018–E51.022, E33.054, 257/E25.028, E25.032, 98, E33.06, E33.067, 257/E33.068, E33.069, E33.072, E23.122; 372/49.01
See application file for complete search history.

(56) References Cited

U.S. PATENT DOCUMENTS

| | | | | |
|---|---|---|---|---|
| 5,691,059 | A * | 11/1997 | Moh | ........................... 428/404 |
| 6,249,534 | B1 * | 6/2001 | Itoh et al. | ................. 372/49.01 |
| 6,831,339 | B2 * | 12/2004 | Bojarczuk et al. | ........... 257/411 |
| 2002/0024981 | A1 | 2/2002 | Tojo et al. | |
| 2003/0183833 | A1 * | 10/2003 | Osaka | .......................... 257/98 |
| 2003/0210722 | A1 * | 11/2003 | Arakida et al. | ................ 372/49 |
| 2004/0233959 | A1 * | 11/2004 | Arakida | ........................ 372/49 |
| 2005/0127383 | A1 * | 6/2005 | Kikawa et al. | ................. 257/98 |
| 2006/0133442 | A1 * | 6/2006 | Kondou et al. | ........... 372/49.01 |
| 2006/0163605 | A1 * | 7/2006 | Miyahara | ..................... 257/103 |
| 2007/0210324 | A1 * | 9/2007 | Kawaguchi et al. | ........... 257/96 |
| 2007/0246720 | A1 * | 10/2007 | Kamikawa et al. | ............. 257/94 |
| 2009/0189184 | A1 * | 7/2009 | Sung | ........................... 257/183 |

FOREIGN PATENT DOCUMENTS

| | | |
|---|---|---|
| JP | 03-049281 | 3/1991 |
| JP | 03-209895 | 9/1991 |
| JP | 09-162496 | 6/1997 |

(Continued)

OTHER PUBLICATIONS

Office Action for co-pending U.S. Appl. No. 11/638,581 dated Apr. 9, 2008.

*Primary Examiner*—Matthew C Landau
*Assistant Examiner*—Joseph C Nicely
(74) *Attorney, Agent, or Firm*—Harness, Dickey & Pierce, P.L.C.

(57) ABSTRACT

In a nitride semiconductor laser bar including a group III-V nitride semiconductor layer, on the front-side cavity end face, a separation layer of aluminum nitride is laid, and further on the separation layer, an end face coating film of aluminum oxide is laid. Likewise, on the rear-side cavity end face, a separation layer of aluminum nitride is laid, and further on the separation layer, an end face coating film of an aluminum oxide/$TiO_2$ multilayer film is laid.

3 Claims, 5 Drawing Sheets

FOREIGN PATENT DOCUMENTS

| | | | |
|---|---|---|---|
| JP | 09162496 A * | 6/1997 | |
| JP | 09-194204 | 7/1997 | |
| JP | 09-283843 | 10/1997 | |
| JP | 2743106 | 2/1998 | |
| JP | 2002-100830 | 4/2002 | |
| JP | 2002-237648 | 8/2002 | |
| JP | 2002-335053 | 11/2002 | |
| JP | 2002335053 A * | 11/2002 | |
| JP | 2005-175111 A | 6/2005 | |
| JP | 2005-340625 | 12/2005 | |
| WO | WO 2005003414 A1 * | 1/2005 | |

* cited by examiner

NITRIDE SEMICONDUCTOR LIGHT-EMITTING DEVICE HAVING AN END FACE COATING FILM AND METHOD OF MANUFACTURING THE SAME

This nonprovisional application claims priority under 35 U.S.C. §119(a) on Patent Application No. 2005-294361 filed in Japan on Oct. 7, 2005, the entire contents of which are hereby incorporated by reference.

BACKGROUND OF THE INVENTION

1. Field of the Invention

The present invention relates to a nitride semiconductor light-emitting device provided with a group III-V nitride semiconductor layer and also with an end-face coating film formed on the end faces of a cavity.

2. Description of Related Art

In recent years, with the demands for increasingly high densities in the storage capacity of optical discs, there have been formulated standards for BD (Blu-ray Disc) and HD-DVD (high-definition DVD) employing blue semiconductor lasers, and there have been commercialized decoders and the like therefor. These newly developed discs offer higher densities (by being ready to be formed into two-layer discs) and allow fast writing. To benefit from these advantages, however, it is necessary to use high-reliability, high-output blue semiconductor lasers.

Conventionally, playback from and writing to CDs and DVDs is achieved by use of an AlGaAs-based or InGaAlP-based semiconductor laser, in which, to prevent degradation of the cavity end faces and to prevent optical damage to the cavity end faces, the cavity end faces are coated with a film of a dielectric such as $SiO_2$, $Si_3N_4$, aluminum oxide, or the like. Disadvantageously, however, it has been confirmed that using this technology in blue semiconductor lasers results in a rapid increase in the drive current. This has been necessitating an improvement in the coating technology.

JP-A-2002-335053, asserting that one cause for degradation of the end faces is poor adhesion of the end face coating film, proposes forming the end face coating film on the cavity end faces with a metal adhesion layer laid in between.

Disadvantageously, however, using a metal film as the adhesion layer causes short-circuiting at the pn junction on the cavity end faces, and also leads to increased light absorption. Since a nitride semiconductor laser operates at a short lasing wavelength and the light it emits has high energy, even slight light absorption degrades the emission end face, making it impossible to realize a high-output device with a light output over 100 mW. On the other hand, from the viewpoints of avoiding short-circuiting at the pn junction and reducing light absorption, the film thickness there needs to be 10 nm or less, more preferably 5 nm or less, and particularly preferably 2 nm or less. This involves difficult control of the film thickness, resulting in diminished yields.

Another disadvantage is that, when an end face coating film formed of an oxide is formed on the cavity end faces directly or with a metal film formed as an adhesion layer in between, the oxygen contained in the end face coating film oxidizes the cavity end faces or the adhesion layer, and thereby lowers the lasing efficiency of the laser light. This not only increases the operating voltage and the power consumption, but also leads to lower durability.

SUMMARY OF THE INVENTION

An object of the present invention is to provide a nitride semiconductor light-emitting device that offers high reliability and high fabrication efficiency by being provided with a separation layer that separates the cavity end faces from the oxygen contained in an end face coating film formed of aluminum oxide, the nitride semiconductor light-emitting device thus requiring no delicate control of film thickness as required when a metal adhesion layer is formed, despite offering sufficient adhesion between the cavity end faces and the end face coating film.

To achieve the above object, according to one aspect of the present invention, a nitride semiconductor light-emitting device is provided with: a group III-V nitride semiconductor layer; a cavity provided in the group III-V nitride semiconductor layer; and an end face coating film formed on an end face of the cavity. Here, the end face coating film has an aluminum oxide layer on the side thereof facing the end face of the cavity. Moreover, a separation layer formed of aluminum nitride is provided between the end face coating film and the end face of the cavity, and the separation layer has a film thickness of 1 nm or more but 20 nm or less.

With this structure, interdiffusion of nitrogen atoms and oxygen atoms occurs at the interface between the separation layer, which is formed of aluminum nitride, and the end face coating film, which has in contact with the separation layer an aluminum oxide layer, which too contains aluminum. This results in good adhesion between the separation layer and the end face coating film, and thereby permits the end face coating film to firmly bond, via the separation layer, to the end face of the cavity. At least part of the aluminum nitride forming the separation layer may be amorphous. This makes fabrication easier than when it involves full crystallization. Furthermore, the use of aluminum nitride, which does not contain oxygen, in the separation layer helps separate the end face from the oxygen contained in the end face coating film, and thus helps prevent oxidization of the end face.

When given a layer thickness of 20 nm or less, the separation layer can be formed in good condition without developing cracks. When a film of aluminum nitride is formed on an end face of a cavity produced by cleaving a nitride semiconductor, the film is closely packed, but contains high internal stresses, which may cause minute cracks and exfoliation. These inconveniences, however, can be avoided by forming the separation layer very thin by giving it a layer thickness of 20 nm or less, and more preferably 10 nm or less. On the other hand, when given a layer thickness less than 1 nm, the separation layer is insufficiently formed, and does not offer sufficient adhesion. Furthermore, as the semiconductor laser is driven continuously, the heat causes the oxygen contained in the coating film to diffuse from inside it to reach the end face, and this may destroy the end surface. Hence, it is preferable that the separation layer have a layer thickness of 1 nm or more but 20 nm or less.

The separation layer is produced typically by a magnetron sputtering process, a plasma CVD (chemical vapor deposition) process, or an ECR (electron cyclotron resonance) sputtering process. In general, aluminum nitride is grown at a high temperature of 400° C. or more by an MOCVD (metal organic chemical vapor deposition) process; by contrast, aluminum nitride can be grown at room temperature by a magnetron sputtering process or an ECR sputtering process and at a temperature of 200° C. or less by a plasma CVD process, these processes thus permitting the separation layer to be formed without degrading the active layer with heat.

According to another aspect of the present invention, a method for fabricating a nitride semiconductor light-emitting device includes: a step of forming a group III-V nitride semiconductor layer; a step of, by cleaving the group III-V nitride semiconductor layer, forming the group III-V nitride semiconductor layer into a cavity; a step of cleaning, with an inert gas, an end face of the cavity formed by cleaving; a step of forming a layer of aluminum nitride on the cleaned end face of the cavity; and a step of forming a layer of aluminum oxide on the surface of the layer of aluminum nitride.

Since the separation layer is very thin, cleaning it with an inert gas and thereby removing as much moisture and oxide film as possible at the end face of the cavity where the separation layer is going to be formed helps increase the adhesion to the end face, and thus helps enhance the effects of the adhesion. It is preferable first to clean the end face of the cavity by ECR sputtering using a plasma of an inert gas and then form the separation layer. So long as a plasma of an inert gas is used, the desired effects can be obtained by performing ECR sputtering by use of a rare gas, such as He, Ne, Ar, or Xe, or nitrogen gas.

DETAILED DESCRIPTION OF PREFERRED EMBODIMENTS

First Embodiment

Figure 1:
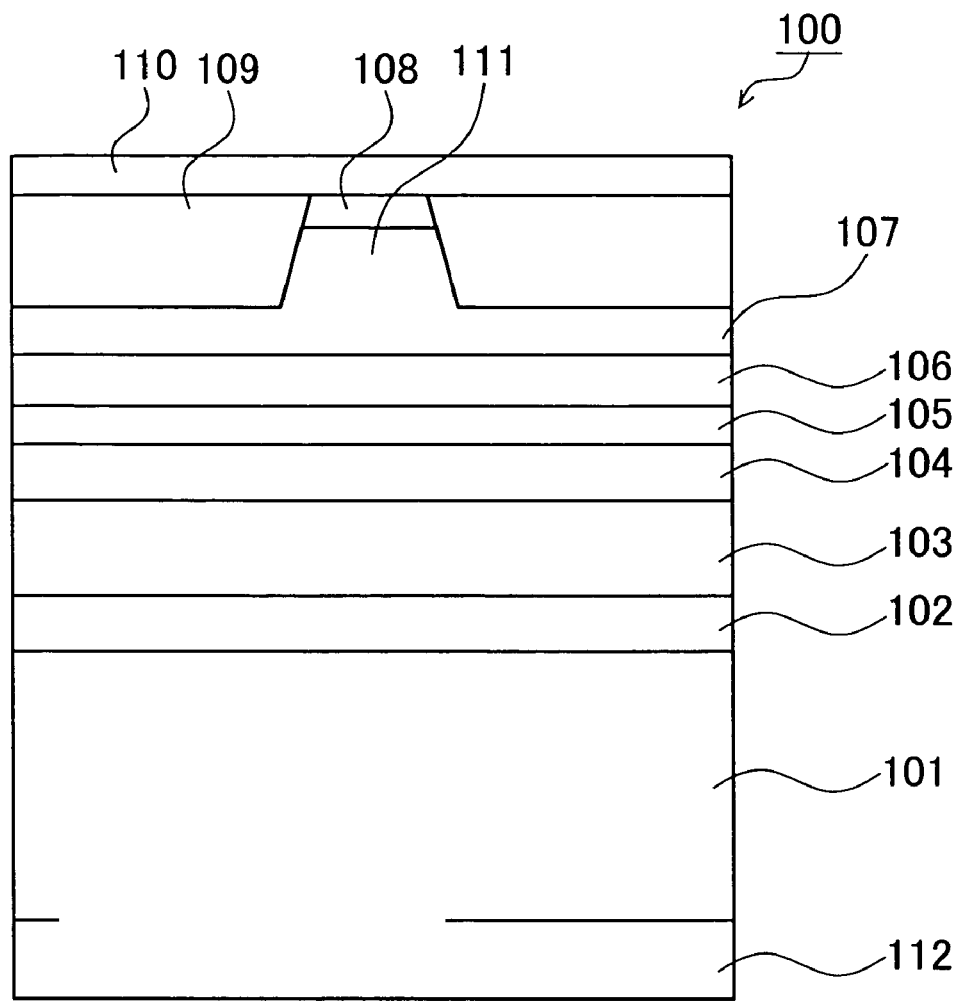
FIG. 1 is a cross-sectional view of a nitride semiconductor laser bar embodying the present invention, taken along a direction perpendicular to the length of the cavity.

A nitride semiconductor wafer having laser structures and electrodes formed thereon is cleaved into bars by scribing and breaking processes using a diamond point. FIG. 1 is a cross-sectional view of a nitride semiconductor laser bar, taken along a direction perpendicular to the length of the cavity. The nitride semiconductor laser bar 100 has the following layers formed on an n-type GaN substrate 101, in the order named therefrom: an n-AlGaInN buffer layer 102, an n-AlGaInN clad layer 103, an n-AlGaInN guide layer 104, an AlGaInN multiple quantum well active layer 105, a p-AlGaInN guide layer 106, a p-AlGaInN clad layer 107, and a p-AlGaInN contact layer 108. These nitride semiconductor layers can be formed of group III-V nitride semiconductors.

The active layer 105 may contain about 0.01% to 10% of a group V material such as As or P. In at least part of the p-AlGaInN guide layer 106, the p-AlGaInN clad layer 107, and the p-AlGaInN contact layer 108, there is provided a stripe-shaped ridge 111 that extends along the cavity. The stripe has a width of about 1.2 µm to 2.4 µm, typically about 1.8 µm.

In contact with the p-AlGaInN contact layer 108, there is provided a p electrode 110. Under the p electrode 110, there is provided an insulating film 109 elsewhere than where the ridge 111 is provided. Thus, the nitride semiconductor laser bar 100 has a so-called ridge stripe structure. Moreover, on the bottom side of the nitride semiconductor laser bar 100, there is formed an n electrode 112.

Figure 2:
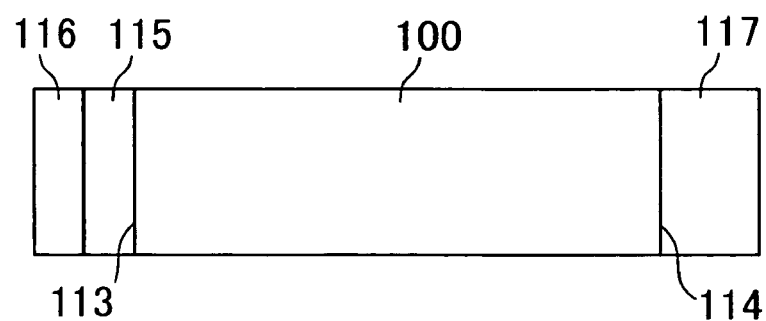
FIG. 2 is a side view of the nitride semiconductor laser bar embodying the present invention, as seen from a side of the length of the cavity.

FIG. 2 is a side view of the nitride semiconductor laser bar, as seen from a side of the length of the cavity. On one cavity end face 113, a separation layer 115 is laid that is formed of a hexagonal crystal containing no oxygen, and, on the surface of the separation layer 115, an end face coating film 116 is laid. On the other cavity end face 114, an end face coating film 117 is laid. The separation layer 115 is formed of a material selected from GaN, AlGaN, InGaN, and the like.

The cleavage plane of the nitride semiconductor laser bar 100 forms the cavity end faces 113 and 114. Fabrication proceeds as follows. Fixed on a holder, the nitride semiconductor laser bar 100 is introduced into an ECR sputtering machine. Then, by ECR sputtering of Ar, the surface of the front-side cavity end face 113 is treated and is thereby cleaned so that the moisture absorbed at the surface and the oxides present there in the form of a naturally formed oxide film are removed. This helps increase the adhesion between the cavity end face 113 and the separation layer 115. The gas used here may be any inert gas, for example, a rare gas other than Ar, namely He, Ne, or Xe, or nitrogen gas, or a mixture gas of Ar and nitrogen gas, or a mixture gas of a rare gas and nitrogen gas.

Subsequently, by ECR sputtering, on the surface of the cavity end face 113, aluminum nitride is laid with a thickness of 10 nm (the separation layer 115), and then, further thereon, aluminum oxide is laid in a single layer (the end face coating film 116). The single-layer aluminum oxide is given a thickness of about $3\lambda/4n$ or $\lambda/4n$ (where $\lambda$ represents the lasing wavelength and n represents the index of refraction) to offer a reflectivity of 5%.

Next, by ECR sputtering of Ar, the surface of the rear-side cavity end face 114 is treated so that the moisture absorbed at the surface and the oxides present there are removed. Subsequently, by ECR sputtering, on the surface of the cavity end face 114, the end face coating film 117 is formed. The end face coating film 117 is formed of a multilayer film composed of a total of 8 layers consisting of four cycles, i.e. pairs, of aluminum oxide/$TiO_2$, with each of the layers given a thickness of $\lambda/4n$ so that the overall reflectivity is 95%. The multilayer film has aluminum oxide as the first layer (the cavity end face 114 side layer) thereof.

Figure 3:
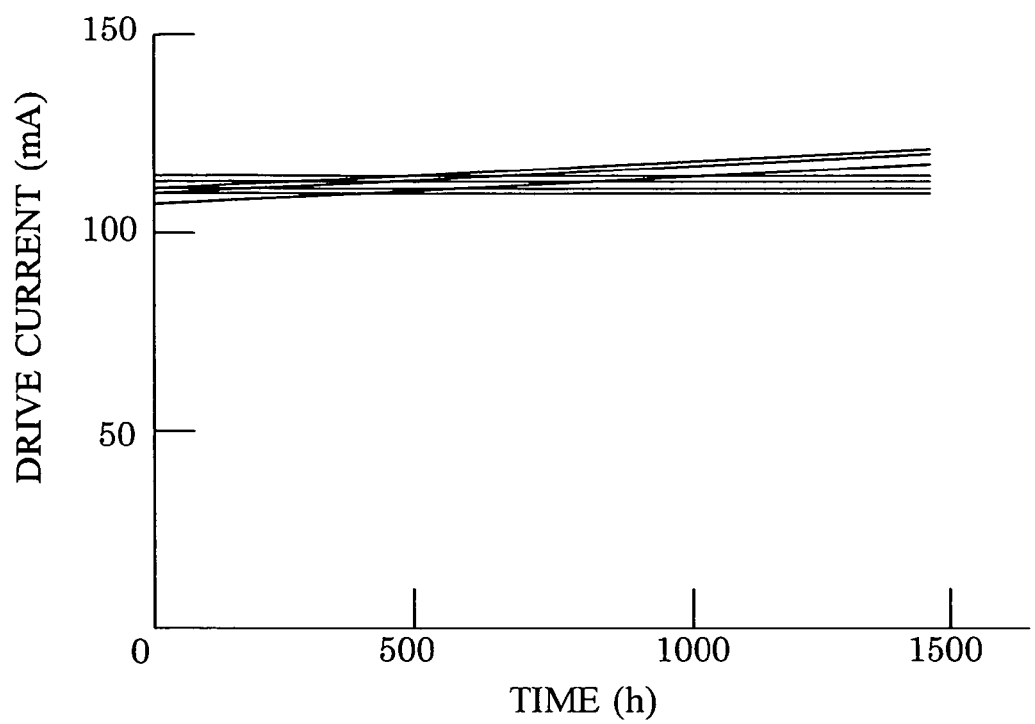
FIG. 3 shows the results of lifetime tests conducted with nitride semiconductor laser devices embodying the present invention.

The nitride semiconductor laser bar 100 is then split into individual chips of nitride semiconductor laser devices, which are then packaged. With samples of so fabricated nitride semiconductor laser devices, lifetime tests were conducted, of which the results are shown in FIG. 3. The tests were conducted at a package temperature of 60° C., while the laser devices were driven with a pulse current so that they emitted light at a fixed peak output of 120 mW. The results are taken individually with seven samples. As FIG. 3 shows, the increases in the drive current throughout the energized period were smaller than ever, and the MTTF (mean time to failure) was about 5000 hours (as estimated from the increases in the drive current at 500 and 1000 hours). Moreover, the yield exhibited no lowering whatsoever due to end face current leakage, and the drive current exhibited no abrupt increase whatsoever throughout the energized period.

On the other hand, with laser devices provided with conventional metal adhesion layers, the MTTF was about 3000 hours, and a lowering of the yield due to end face current leakage was observed in five in ten devices, i.e. 50% of them. In laser devices that suffer from end face current leakage, irrespective of whether they are subjected to aging, the operating current is large already in their initial characteristics. On the other hand, one of the causes that degrade the MTTF is the phenomenon of an abrupt increase in the drive current during driving. This accompanies a destructive degradation of a cavity end face resulting from light absorption, film exfoliation, or film deterioration at the end face. When a metal layer is used as an adhesion layer as conventionally practiced, although it is very thin, it absorbs light, and thus causes the just-mentioned degradation. By contrast, according to the present invention, the separation layer 115 does not absorb light; moreover, the separation layer 115 has low electrical conductivity, and is therefore unlikely to cause end face current leakage; in addition, the separation layer 115 offers, across it, excellent adhesion between the cavity end face 113 and the end face coating film 116; furthermore, the separation layer 115 prevents diffusion of the oxygen in the end face coating film to the end face, and thereby prevents oxidization of the end face. These benefits combine to prevent the above-mentioned phenomenon.

Figure 4:
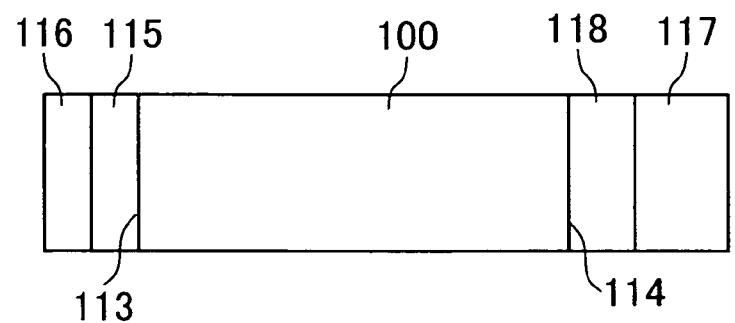
FIG. 4 is a side view of another nitride semiconductor laser bar embodying the present invention, as seen from a side of the length of the cavity.

FIG. 4 is a side view of another nitride semiconductor laser bar of the first embodiment, as seen from a side of the length of the cavity. On one cavity end face 113, a separation layer 115 is laid that is formed of a hexagonal crystal, and, on the surface of the separation layer 115, an end face coating film 116 is laid. On the other cavity end face 114, a separation layer 118 is laid that is formed of a hexagonal crystal, and, on the surface of the separation layer 118, an end face coating film 117 is laid.

Fabrication proceeds as follows. Fixed on a holder, the nitride semiconductor laser bar 100 is introduced into an ECR sputtering machine. Then, by ECR sputtering of Ar, the surface of the front-side cavity end face 113 is treated so that the moisture absorbed at the surface and the oxides present there are removed. Subsequently, by ECR sputtering, on the surface of the cavity end face 113, InN is laid with a thickness of 20 nm (the separation layer 115), and then, further thereon, aluminum oxide is laid in a single layer (the end face coating film 116). The single-layer aluminum oxide is given a thickness of about $3\lambda/4n$ (where $\lambda$ represents the lasing wavelength and n represents the index of refraction) to offer a reflectivity of 5%.

Next, by ECR sputtering of Ar, the surface of the rear-side cavity end face 114 is treated so that the moisture absorbed at the surface and the oxides present there are removed. Subsequently, by ECR sputtering, on the surface of the cavity end face 114, the separation layer 118 formed of $Al_xGa_{1-x}N$ (where X=0.2, or any other value within the range of $0 \leq X \leq 1$) is laid with a thickness of 20 nm, and then, further thereon, the end face coating film 117 is laid. The end face coating film 117 is formed of a multilayer film composed of a total of 8 layers consisting of four cycles, i.e. pairs, of $SiO_2$/$TiO_2$, with each of the layers given a thickness of $\lambda/4n$ so that the overall reflectivity is 95%.

The nitride semiconductor laser bar 100 is then split into individual chips of nitride semiconductor laser devices, which are then packaged. With samples of so fabricated nitride semiconductor laser devices, lifetime tests were conducted under the same conditions as those previously described (the results are omitted). In these lifetime tests, too, the drive current exhibited no abrupt increase whatsoever throughout the energized period.

In the first embodiment, the separation layers 115 and 118 may each be formed of any material that can form a hexagonal crystal, for example, to name a few, GaN, AlGaN, or InGaN. Conventionally, an adhesive layer is formed as a metal layer, in which case an end face coating film bonds thereto with the intermolecular force, which is a weak bonding force. By contrast, when one of the materials specifically mentioned above is used in the separation layers 115 and 118, since these materials have the same crystal system as the AlGaInN semiconductors of which the nitride semiconductor layers are formed, the separation layers 115 and 118 bond, more firmly than ever, to the end face coating films 116 and 117 and to the cavity end faces 113 and 114. In this way, it is possible, while suppressing current leakage and light absorption as occur when a metal layer is used as an adhesion layer, to keep the end face coating films 116 and 117 in firm and close contact with the cavity end faces 113 and 114 via the separation layers 115 and 118.

In a nitride semiconductor laser device that produces laser light at a short wavelength, a preferred material for the end face coating films 116 and 117 formed on the cavity end faces 113 and 114 is aluminum oxide, because it is transparent in a short wavelength region about 400 nm, because it develops comparatively low stresses, though depending on film formation conditions, and because it is thermally stable. Thus, forming the end face coating films 116 and 117 with aluminum oxide makes it possible to fabricate nitride semiconductor laser devices suitable for driving at high light outputs. In this case, it is preferable that the separation layers 115 and 118 be formed of a compound containing an constituent element common to the material of the end face coating films 116 and 117 laid thereon. Hence, a preferred material for the separation layers 115 and 118 is a compound containing aluminum as an element common to aluminum oxide, for example, aluminum nitride.

When aluminum oxide is laid, as the end face coating films 116 and 117, directly on the cavity end faces 113 and 114, poor adhesion results, and in addition the oxygen in the aluminum oxide oxidizes the cavity end faces 113 and 114. The so oxidized cavity end faces 113 and 114, it has been confirmed, develop an increased number of non-light-emitting centers, and produce an accordingly increased amount of heat at the interfaces, resulting in poor long-term reliability and diminishing the COD (catastrophic optical damage) level of the nitride semiconductor laser device. By contrast, forming the separation layers 115 and 118 with aluminum nitride, which does not contain oxygen as a constituent element thereof, helps keep the oxygen in the aluminum oxide forming the end face coating films 116 and 117 away from the cavity end faces 113 and 114, and thus helps prevent oxidization of the cavity end faces 113 and 114, thereby enhancing the long-term reliability of the nitride semiconductor laser device.

In general, an oxide material (for example, aluminum oxide, $SiO_2$, $TiO_2$, $Ta_2O_5$, $Nb_2O_5$, or $ZrO_2$) develops low internal stresses, and therefore laying a thick film thereof on the surface of a nitride semiconductor has little effect thereon. By contrast, a nitride material tends to develop high internal stresses, and therefore laying a thick film thereof on the surface of a nitride semiconductor affects the nitride semiconductor so greatly as to degrade the aging characteristic thereof. For these reasons, laying an oxide material as an end face coating film directly on the surface of a cavity end face is preferable from the viewpoint of the effect of internal stresses, but is practically unsuitable because doing so causes oxidization of the cavity end face.

The end face coating films 116 and 117 may be formed of a compound containing a constituent element common to the material of the separation layers 115 and 118 laid thereon. The end face coating films 116 and 117 may have a multilayer structure of any of the oxides and nitrides mentioned above.

Of the separation layers 115 and 118, at least the one provided between the light-exit-side end face of the cavity and the end face coating film 116 or 117 is indispensable. Given a thickness of 20 nm or less, the separation layers 115 and 118 can be laid in good condition without developing cracks. The separation layers 115 and 118 can be formed by an ECR sputtering process as described above, and may instead be formed by a plasma CVD process or a magnetron sputtering process. In general, aluminum nitride, GaN, AlGaN, InGaN, and the like are grown at a high temperature of 400° C. or more by an MOCVD process; by contrast, they can be grown at room temperature by a magnetron sputtering process or an ECR sputtering process and at a temperature of 200° C. or less by a plasma CVD process, these processes thus permitting the separation layers 115 and 118 to be formed without degrading the active layer 105.

Second Embodiment

Next, a second embodiment of the present invention will be described. The second embodiment is the same as the first embodiment except that, in the second embodiment, a separation layer is formed exclusively of aluminum nitride.

The nitride semiconductor laser bar of the second embodiment has the structure shown in FIG. 2, but the separation layer 115 is formed exclusively of aluminum nitride. The nitride semiconductor layers have the same structure as in the first embodiment. The end face coating film 116 is formed of aluminum oxide, and the end face coating film 117 is formed of a multilayer film of aluminum oxide/$TiO_2$.

A suitable material for the low-reflectivity end face coating film 116 formed on the cavity end face 113 of the nitride semiconductor laser bar 100 is aluminum oxide, because it is transparent in a short wavelength region about 400 nm, because it develops comparatively low stresses, though depending on film formation conditions, and because it is thermally stable, these properties making aluminum oxide suitable for forming a coating film in a nitride semiconductor laser device that produces laser light at a short wavelength. Forming the end face coating film 116 with aluminum oxide makes the fabricated nitride semiconductor laser device suitable for driving at high light outputs.

Moreover, in the second embodiment, the end face coating film 116, which is formed of aluminum oxide, and the separation layer 115, which is formed of aluminum nitride and on which the end face coating film 116 is formed, both contain Al as a common constituent element thereof, and this causes, in the several-atom-thick interface layer between the end face coating film 116 and the separation layer 115, interdiffusion of N and O, producing $AlN_xO_y$ ($x<1$, $y<1$, and $x+y=1$). Hence, even when the aluminum nitride forming the separation layer 115 is not completely crystallized, it exhibits increased adhesion to the aluminum oxide forming the end face coating film 116. This helps stabilize the COD level, the lifetime, and other properties of the nitride semiconductor laser device. Thus, the aluminum nitride may be entirely crystallized; or part of it may be left amorphous, in which case the separation layer 115 can be formed more easily than when full crystallization is involved. Moreover, the interface thus formed does not absorb light, making such a combination of the separation layer 115 and the end face coating film 116 an excellent choice.

When aluminum oxide is laid, as the end face coating film 116, directly on the cavity end face 113, poor adhesion results, and in addition the oxygen in the aluminum oxide oxidizes the cavity end face 113. The so oxidized cavity end face 113 develops an increased number of non-light-emitting centers, and produces an accordingly increased amount of heat at the interface between the cavity end face 113 and the end face coating film 116, resulting in poor long-term reliability. By contrast, forming the separation layer 115 with aluminum nitride helps keep the oxygen in the aluminum oxide forming the end face coating film 116 away from the cavity end face 113, and thus helps prevent oxidization of the cavity end face 113, thereby enhancing the long-term reliability of the nitride semiconductor laser device obtained from the nitride semiconductor laser bar 100.

Moreover, forming an aluminum oxide film as the end face coating film 116 on the separation layer 115 laid as an aluminum nitride film makes Al an element common to them. In this case, by use of an ECR reactive sputtering machine or the like in combination with an Al metal target, it is possible, during sputtering, to change the type of film formed by choosing whether to mix nitrogen or oxygen with Ar. Thus, it is possible to continue film formation without taking the nitride semiconductor laser bar 100 out of the ECR sputtering machine and hence without exposing the separation layer 115 and the end face coating film 116 to the atmosphere. This suppresses formation of a naturally formed oxide film on, and attachment of impurities in air to, the surface of the separation layer 115 before the formation of the end face coating film 116, and thus helps increase the adhesion between the cavity end face 113 and the end face coating film 116 via the separation layer 115.

Next, the fabrication method of the nitride semiconductor laser bar 100 of the second embodiment will be described.

Preprocessing

Fixed on a holder, the nitride semiconductor laser bar 100 is introduced into an ECR sputtering machine. Then, by ECR sputtering of Ar, the surface of the front-side cavity end face 113 is treated so that the moisture absorbed at the surface and the oxides present there are removed. This helps increase the adhesion between the cavity end face 113 and the separation layer 115. The gas used here may be any inert gas, for example, a rare gas other than Ar, namely He, Ne, or Xe, or nitrogen gas, or a mixture gas of Ar and nitrogen gas, or a mixture gas of a rare gas and nitrogen gas.

Film Formation (Low-Reflectivity Side)

Next, a description will be given of how the separation layer 115 and the end face coating film 116 are formed in the ECR sputtering machine. In the second embodiment, the aluminum nitride film forming separation layer 115 laid in contact with the cavity end face 113 has a thickness of 20 nm, and the aluminum oxide film forming the end face coating film 116 has a thickness of 70 nm. Here, since the aluminum nitride film forming the separation layer 115 is as thin as 20 nm, it has little effect on the reflectivity of the end face coating film 116.

First, argon gas (at a flow rate of 20 ccm) and nitrogen gas (at a flow rate of 5 ccm to 6 ccm) are introduced into the ECR sputtering machine, and are brought into a plasma state. Here, the pressure inside the ECR sputtering machine is about $5 \times 10^{-2}$ Pa, the microwave power is 500 W, and the output of the RF power supply connected to the Al target is 500 W. In this state, when a shutter provided right under the holder to separate the Al target from the ECR sputtering machine is opened, an aluminum nitride film starts to be formed as the separation layer 115. Here, the thickness of the aluminum nitride film is controlled to be 20 nm or less, for example, 20 nm in this embodiment. Thereafter, the shutter is closed, and the nitrided surface of the Al target is sputtered with an Ar plasma so as to expose a metal surface.

Thereafter, argon gas (at a flow rate of 40 ccm) and oxygen gas (at a flow rate of 6 ccm to 7 ccm) are introduced into the processing chamber, and are brought into a plasma state. Here, the pressure inside the ECR sputtering machine is about $1 \times 10^{-1}$ Pa, the microwave power is 500 W, and the output of the RF power supply connected to the Al target is 500 W. In this state, when the shutter provided right under the holder is opened, an aluminum oxide film is ready to be formed as the end face coating film 116. In a case where, as in a nitride semiconductor laser device, laser light is produced at a wavelength about 400 nm, since the lasing wavelength $\lambda$=400 nm and the index of refraction n=1.6, and hence $\lambda/4n$=62.5 nm, giving the aluminum oxide film a film thickness of about 70 nm makes it offer a reflectivity of 5%. Here, the film thickness is controlled in the following manner: in advance, film formation is tentatively performed on a dummy bar or the like, and the reflectivity is measured to study the film formation rate; then, based on the thus studied film formation rate, the duration for which the shutter is kept open is controlled. The cavity end face 113 that thus has the low-reflectivity end face coating film 116 formed thereon is the front-side one, and the opposite cavity end face 114 is the rear-side one.

Here, the separation layer 115 may be formed otherwise than by an ECR sputtering process; it may be formed, for example, by sputtering or by a plasma CVD process. Whereas an MOCVD process requires a high temperature of 400° C. or more, formation of a closely packed film is possible at room temperature by an ECR sputtering process, and at a temperature of 200° C. or less by a plasma CVD process. As a result, around the lasing wavelength (at wavelengths of about 300 nm to 600 nm) of the nitride semiconductor layers, no absorption whatsoever of light occurs, nor does the interface between the nitride semiconductor layers and the separation layer 115 absorb light. Moreover, since no heating is needed, no degradation occurs in the nitride semiconductor layers. Hence, it is preferable that the separation layer 115 be formed by sputtering, by a plasma CVD process, or by an ECR sputtering process. The end face coating film 116 may be formed of other than a single-layer aluminum film; it may be formed of a plurality of layers of different compositions so long as the layer laid in contact with the separation layer 115 is an aluminum oxide layer.

Film Formation (High-Reflectivity Side)

Next, i.e. after the completion of the formation of the end face coating film 116, the holder is taken out, and the setting is so changed that film formation is now possible on the rear-side cavity end face 114. Then, the end face coating film 117 with a reflectivity as high as about 95% is formed by the procedure basically the same as that for the front side. Specifically, on the rear-side cavity end face 114, just as on the opposite side, an aluminum nitride film is formed as the separation layer 118. Subsequently, on the separation layer 118, the end face coating film 117 is formed, which is here formed of a multilayer film composed of a total of 8 layers consisting of four cycles, i.e. pairs, of aluminum oxide/$TiO_2$. Each of these layers is given a thickness of $\lambda/4n$ so that the overall reflectivity is 95%. The aluminum nitride film forming the separation layer 118 is given a thickness of about 6 nm. Since the separation layer 118 is thin, its has little effect on the reflectivity of the end face coating film 117. Here, coating with the same separation layer as on the front side (although the film thickness differs, the preprocessing, the film formation conditions, etc. are the same) helps give the rear-side cavity end face 114 sufficient durability.

In general, however, the light density around the rear-side, high-reflectivity end face coating film 117 is lower than that around the front-side, low-reflectivity end face coating film 116. Hence, less heat is produced on the rear side than on the front side, making destruction less likely on the rear side. Thus, the rear-side separation layer 118, although it is formed in the second embodiment under the same conditions as in the front-side separation layer 115, may be formed under different conditions, or of a different kind of film (i.e. a different material such as $TiO_2$, $Ta_2O_5$, $ZrO_2$, $Nb_2O_5$, or $Y_2O_5$). The end face coating film 117 may be formed of other than aluminum oxide/$TiO_2$ so long as it offers a reflectivity of about 95%; it may be formed as, for example, a nine-layer coating consisting of $SiO_2/TiO_2/SiO_2/TiO_2/SiO_2/TiO_2/SiO_2/TiO_2/SiO_2$.

Splitting into Chips, and Mounting

After the completion of the formation of the front- and rear-side end face coating films 116 and 117, the nitride semiconductor laser bar 100 is then split, by use of a scribing and breaking machine, into individual nitride semiconductor laser devices in the form of separate chips. Thereafter, the split nitride semiconductor laser devices are individually mounted on submounts of aluminum nitride, SiC, or the like, and these submounts are then, each along with what is already mounted thereon, individually mounted on stems. Thereafter, the nitride semiconductor laser devices are subjected to wire bonding so as to be connected to the pins provided on the stems, and are then sealed with caps under the atmosphere so as to be finished as end products.

Comparison Between Laser Devices with and without a Separation Layer

Figure 5:
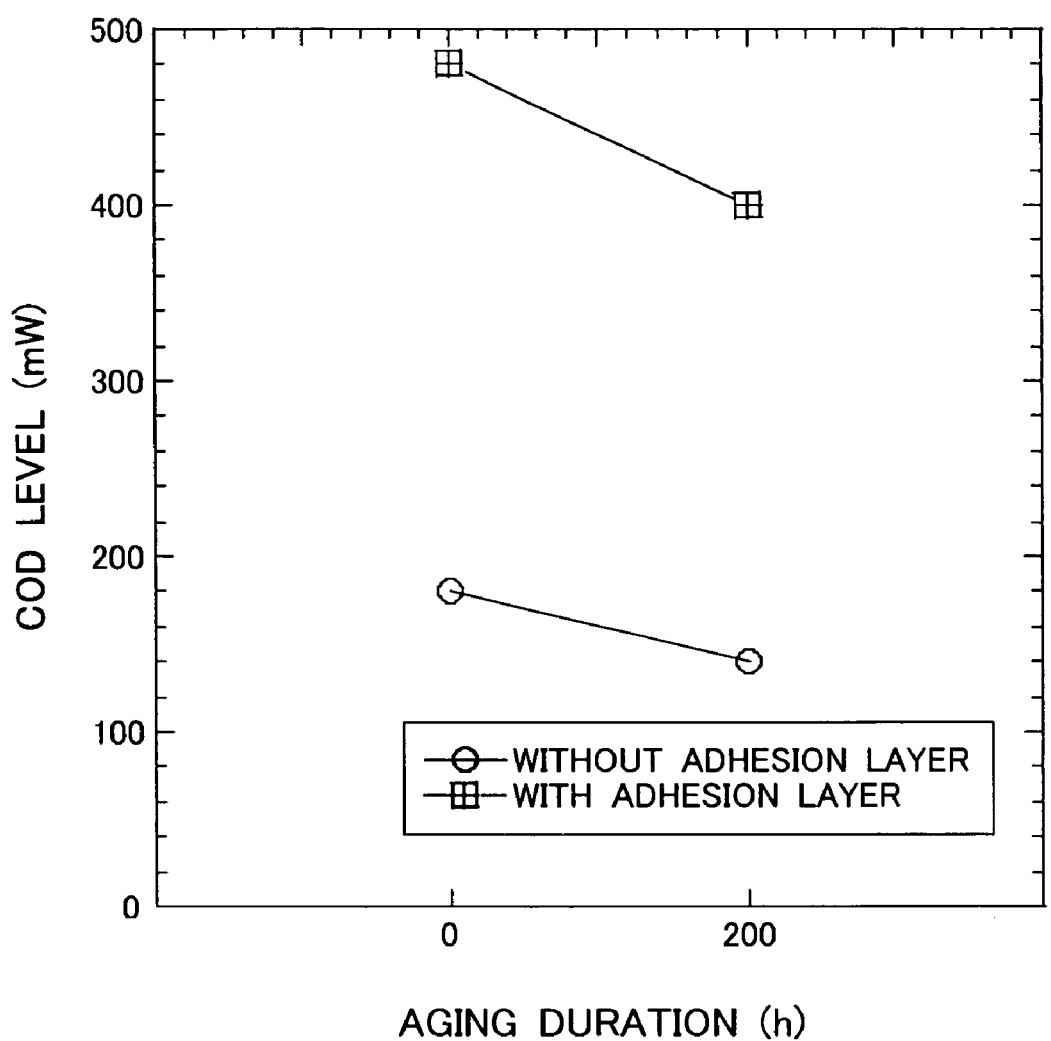
FIG. 5 is a graph showing the temporal variation of the COD level in a device provided with a separation layer and a device provided with no separation layer.

The COD level observed in the initial state and that observed after 200 hours of aging were measured with each of: (a) the nitride semiconductor laser device of the second embodiment fabricated as described above, i.e. the nitride semiconductor laser device having, formed on the front-side cavity end face 113 thereof, the separation layer 115 of an aluminum nitride film and, further thereon, the end face coating film 116 of aluminum oxide; and (b) a comparative example, specifically a nitride semiconductor laser device having, formed on the front-side cavity end face 113 thereof, only an end face coating film of aluminum oxide with no separation layer formed in between. The aging was performed under the following conditions: by APC (automatic, i.e. fixed, power control) driving, at a device temperature of 70° C., and at an output of 60 mW. The COD level was measured under the following conditions: with pulses having a pulse width of 50 nm and a duty factor of 50%, and at room temperature. FIG. 5 shows the temporal variation of the COD level. The results are shown in Table 1.

TABLE 1

| | With Separation Layer | Without Separation Layer |
|---|---|---|
| Initial Value [mW] | 480 | 180 |
| After 200 Hours [mW] | 400 | 140 |

These results show that providing the separation layer 115 helps realize a COD level about three times higher than where no separation layer is provided, both before and after aging.

Figure 6:
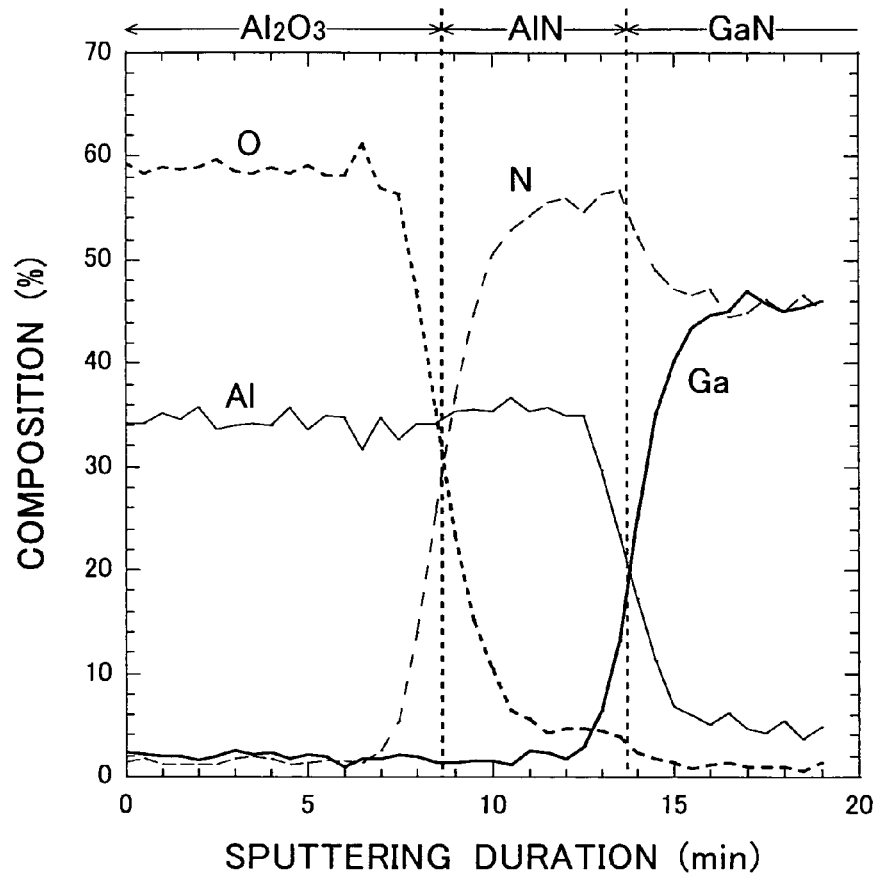
FIG. 6 shows the results of AES analysis of an end face part of a device coated with an aluminum nitride aluminum oxide film and subjected to aging.

The reasons that the provision of the separation layer 115 helps greatly increase the COD level are believed to be as follows. When a nitride semiconductor is cleaved, the resulting face, thus including a cavity end face, has voids or the like resulting from escaping of nitrogen. Thus, in a case where the nitride semiconductor is GaN, the amount of nitrogen is less than matches that of Ga, meaning that the nitride semiconductor is Ga-rich at the end face as compared with elsewhere. If an oxide film such as an aluminum oxide film is formed directly on this Ga-rich face, the excess Ga left after escaping of nitrogen bonds to oxygen to form non-light-emitting centers or the like. By contrast, when the separation layer 115 of aluminum nitride is formed on this face, it supplements the nitrogen that has escaped, and thereby turns back to normal the end face of the nitride semiconductor; moreover, it prevents oxidization of Ga, and thereby allows formation of a stable interface with few non-light-emitting centers. Moreover, an aluminum nitride film has about four times the thermal conductivity of an aluminum oxide film, and thus excels in heat dissipation, reducing the raise in the temperature of the end face coating film 116 and thereby enhancing the COD level. FIG. 6 shows the results of composition analysis conducted in an end face part of a laser device according to the present invention that has gone through 200 hours of aging, as observed by AES (Auger electron spectroscopy) performed from the surface inward. Here, the aluminum nitride has a thickness of 20 nm. In FIG. 6, the vertical axis represents the composition of different elements, and the horizontal axis represents the duration of sputtering. Since sputtering is performed starting at the outermost surface of the end face coating film 116, the part of the chart where the sputtering duration is zero minutes corresponds to the outermost surface of the end face coating film 116; along the lapse of the sputtering duration, different parts of the chart correspond to, first, the interior of the end face coating film, then the separation layer 115, and then the nitride semiconductor layers. FIG. 6 shows the following: even after the aging test, the oxygen in the aluminum oxide forming the end face coating film 116 is prevented by the separation layer 115 of aluminum nitride from reaching the surface of the GaN of the nitride semiconductor layer; thus, the separation layer 115 of aluminum nitride certainly separates oxygen from the cavity end face 113.

Comparison Among Laser Devices with Different Separation Layer Thicknesses

Next, the COD levels before and after 200 hours of aging were evaluated with nitride semiconductor laser devices each having the separation layer 115 formed with a different film thickness. Among the nitride semiconductor devices used, the thickness of the separation layer 115 varied between 1 nm to 50 nm. The aging was performed under the following conditions: by APC driving, at a device temperature of 70° C., and at an output of 60 mW. The COD level was measured under the following conditions: with pulses having a pulse width of 50 nm and a duty factor of 50%, and at room temperature. The film thickness of the aluminum oxide film forming the end face coating film 116 is determined such that it, in combination with the aluminum nitride forming the separation layer 115, exhibits a reflectivity of 5% to 10% to light of a wavelength of 405 nm.

Figure 7:
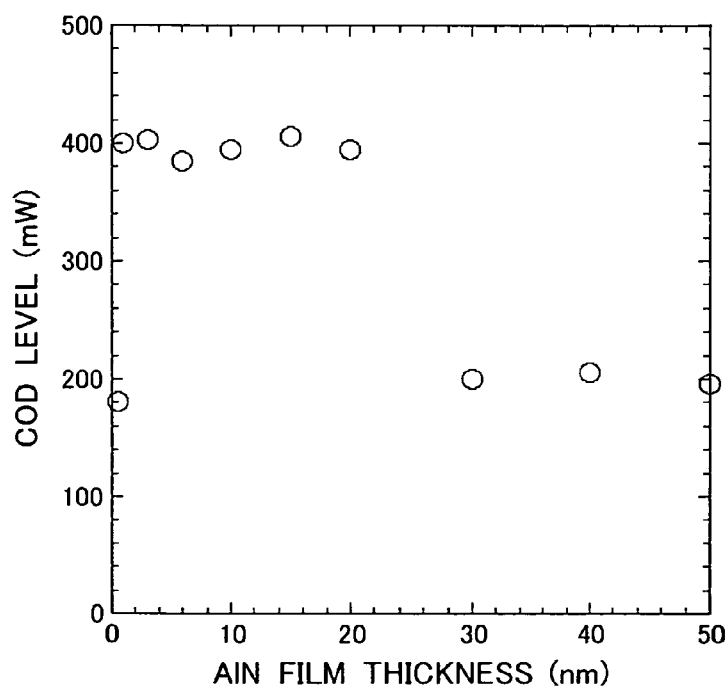
FIG. 7 is a graph showing the coating film thickness dependence of the COD level of devices provided with a separation layer and subjected to 200-hour aging.
Figure 8A:
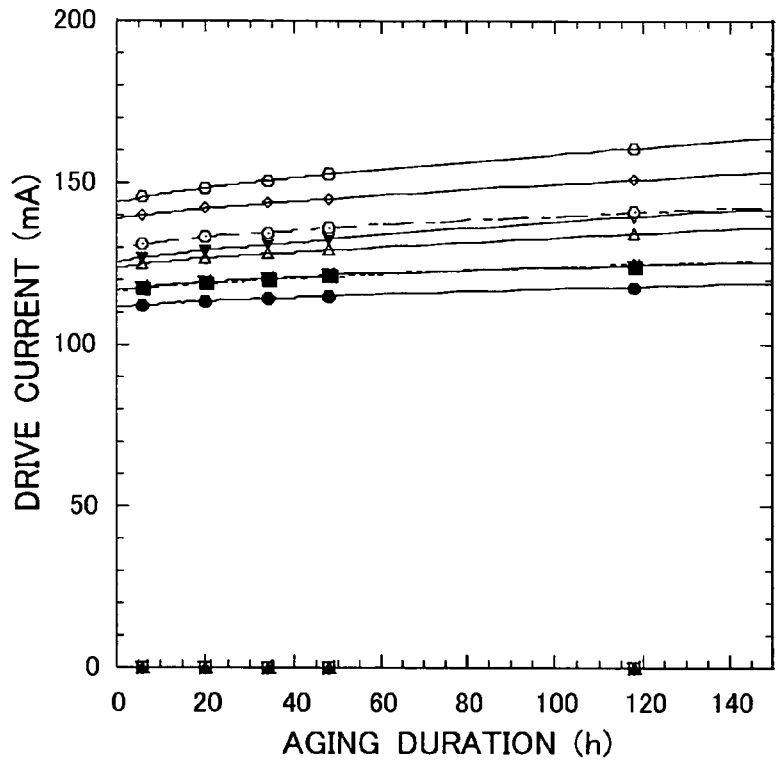
FIG. 8A is a graph showing the aging characteristics of devices provided with a 6 nm thick separation layer.
Figure 8B:
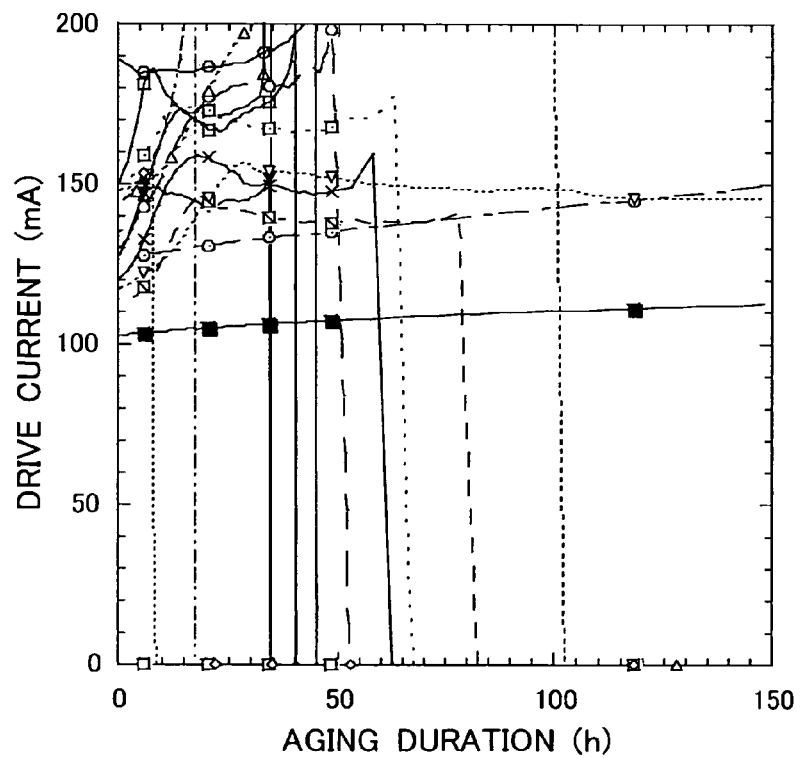
FIG. 8B is a graph showing the aging characteristics of devices provided with a 50 nm thick separation layer.

FIG. 7 is a graph showing the results of the evaluation, the horizontal axis representing the film thickness of the aluminum nitride film, and the vertical axis representing the COD level. FIG. 7 shows that giving the aluminum nitride film a thickness greater than 20 nm results in a diminished COD level. If the aluminum nitride is made thinner than 1 nm (a case where it is 0.5 nm thick is shown in FIG. 7), the aluminum oxide film forming the end face coating film 116 cannot be separated from the cavity end face 113, with the result that, undesirably, the oxygen in the aluminum oxide reacts with Ga in the nitride semiconductor at the cavity end face 113, and thereby produces oxides of Ga, increasing the number of non-light-emitting centers at the interface and thus increasing the amount of heat generated. FIGS. 8A and 8B are graphs showing the results of the same evaluation, the horizontal axis representing the duration of aging and the vertical axis representing the drive current. FIG. 8A shows the results with 10 samples in which the aluminum nitride had a film thickness of 6 nm, and FIG. 8B shows the results with 15 samples in which the aluminum nitride had a film thickness of 50 nm. FIGS. 8A and 8B show the following: with a 6 nm thick aluminum nitride film, the drive current (Iop) during aging rises very slowly, and no degradation is observed in the lifetime; with a 50 nm thick aluminum nitride film, except for two samples, the drive current (Iop) rises rapidly, and remarkable degradation is observed in the lifetime. This is believed to be attributable to the stresses in the aluminum nitride film. Incidentally, two samples are shown in FIG. 8A of which the drive current remained at 0 mA from the beginning of aging; this is attributable to a problem with the measurement equipment, and has essentially nothing to do with the present invention. Hence, the results as a whole indicate that it is preferable that the aluminum nitride forming the separation layer 115 be given a thickness of 1 nm or more but 20 nm or less.

When aluminum nitride is laid on a cavity end face formed by cleaving a nitride semiconductor, it forms a closely packed film, but contains high internal stresses, which may cause minute cracks and exfoliation. This inconvenience, however, can be overcome by forming the separation layer 115 as thin as 20 nm or less, and more preferably 10 nm or less. If the film thickness of the separation layer is less than 1 nm, the separation layer is insufficiently formed, and does not offer sufficient adhesion. Hence, out of these considerations too, it is preferable that the aluminum nitride forming the separation layer 115 be given a film thickness of 1 nm or more but 20 nm or less.

The first and second embodiments deal with cases where the end faces of the nitride semiconductor is formed by cleaving. It should be understood, however, that the present invention is equally applicable, without any problems, in cases where such end faces are formed as etched faces (etched mirrors) by vapor-phase etching such as RIE (reactive ion etching) ICP or by wet etching using a solution of, for example KOH (potassium hydroxide).

Nitride semiconductor light-emitting devices according to the present invention find applications in nitride semiconductor laser devices, for example, semiconductor laser devices for use by themselves, hologram laser devices provided with hologram devices, optoelectronic IC devices packaged so as to be integral with IC chips for driving or for processing such as signal detection, and composite optical devices packaged so as to be integral with wage guides or micro-optical devices. Moreover, the present invention finds applications in optical recording systems, optical disc systems, light source systems operating in an ultraviolet to green region, and the like incorporating such nitride semiconductor laser devices.

What is claimed is:
1. A nitride semiconductor light-emitting device comprising:
   a group III-V nitride semiconductor layer;
   a cavity provided in the group III-V nitride semiconductor layer; and
   an end face coating film formed on an end face of the cavity, wherein the end face coating film has an oxide layer on a side thereof facing the end face of the cavity, a separation layer formed of aluminum nitride is provided between the end face coating film and the end face of the cavity, at least a part of the aluminum nitride forming the separation layer is amorphous, and a crystallized part of the aluminum nitride has a hexagonal crystal system.

2. The nitride semiconductor light-emitting device according to claim 1, wherein the separation layer is produced by a magnetron sputtering process, a plasma CVD process, or an ECR sputtering process.

3. The nitride semiconductor light-emitting device according to claim 1, wherein the oxide is aluminum oxide or silicon dioxide.

* * * * *